US008080726B2

(12) United States Patent
Hayes

(10) Patent No.: US 8,080,726 B2
(45) Date of Patent: *Dec. 20, 2011

(54) SOLAR CELL MODULES COMPRISING COMPOSITIONALLY DISTINCT ENCAPSULANT LAYERS

(75) Inventor: Richard Allen Hayes, Beaumont, TX (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 371 days.

This patent is subject to a terminal disclaimer.

(21) Appl. No.: 11/796,858

(22) Filed: Apr. 30, 2007

(65) Prior Publication Data

US 2008/0264481 A1 Oct. 30, 2008

(51) Int. Cl.
*H01L 31/101* (2006.01)

(52) U.S. Cl. ......... 136/251; 136/256; 136/258; 136/259

(58) Field of Classification Search .................. 136/251, 136/259
See application file for complete search history.

(56) References Cited

U.S. PATENT DOCUMENTS

| | | | |
|---|---|---|---|
| 3,344,014 A | 9/1967 | James | |
| 3,957,537 A | 5/1976 | Baskett et al. | |
| 4,401,839 A * | 8/1983 | Pyle | 136/251 |
| 4,636,578 A * | 1/1987 | Feinberg | 136/251 |
| 5,167,724 A * | 12/1992 | Chiang | 136/246 |
| 5,476,553 A | 12/1995 | Hanoka et al. | |
| 5,478,402 A | 12/1995 | Hanoka | |
| 5,582,653 A * | 12/1996 | Kataoka et al. | 136/251 |
| 5,733,382 A | 3/1998 | Hanoka | |
| 5,741,370 A | 4/1998 | Hanoka | |
| 5,762,720 A | 6/1998 | Hanoka et al. | |
| 5,763,062 A | 6/1998 | Smith et al. | |
| 5,986,203 A | 11/1999 | Hanoka et al. | |
| 6,114,046 A | 9/2000 | Hanoka | |
| 6,187,448 B1 | 2/2001 | Hanoka et al. | |
| 6,319,596 B1 | 11/2001 | Kernander et al. | |
| 6,320,116 B1 | 11/2001 | Hanoka | |
| 6,353,042 B1 | 3/2002 | Hanoka et al. | |
| 6,586,271 B2 | 7/2003 | Hanoka | |
| 6,660,930 B1 | 12/2003 | Gonsiorawski | |
| 6,693,237 B2 * | 2/2004 | Yamada et al. | 136/251 |
| 6,777,610 B2 | 8/2004 | Yamada et al. | |
| 6,940,008 B2 | 9/2005 | Shiotsuka et al. | |
| 2002/0179139 A1* | 12/2002 | Hashimoto et al. | 136/251 |
| 2003/0000568 A1 | 1/2003 | Gonsiorawski | |
| 2003/0098059 A1* | 5/2003 | Hanoka | 136/251 |
| 2003/0124296 A1* | 7/2003 | Smith | 428/49 |
| 2004/0144415 A1 | 7/2004 | Arhart | |
| 2005/0279401 A1 | 12/2005 | Arhart et al. | |
| 2005/0284516 A1 | 12/2005 | Koll | |
| 2006/0057392 A1 | 3/2006 | Smillie et al. | |
| 2006/0084763 A1 | 4/2006 | Arhart et al. | |
| 2006/0141212 A1 | 6/2006 | Smith et al. | |
| 2006/0165929 A1 | 7/2006 | Lenges et al. | |
| 2006/0182983 A1 | 8/2006 | Paul et al. | |
| 2008/0017241 A1* | 1/2008 | Anderson et al. | 136/251 |
| 2008/0156365 A1* | 7/2008 | Scholz et al. | 136/251 |
| 2008/0190481 A1* | 8/2008 | Hayes et al. | 136/251 |
| 2009/0023867 A1 | 1/2009 | Nishijima et al. | |
| 2009/0120489 A1 | 5/2009 | Nishijima et al. | |

FOREIGN PATENT DOCUMENTS

| | | |
|---|---|---|
| JP | 56-116047 | 2/1983 |
| JP | 2-94574 | 4/1990 |
| JP | 06-322334 A | 11/1994 |
| JP | 08-316508 A | 11/1996 |
| JP | 11-026791 A | 1/1999 |
| JP | 2000-186114 A | 7/2000 |
| JP | 2001-089616 A | 4/2001 |
| JP | 2001-119047 A | 4/2001 |
| JP | 2001-119056 A | 4/2001 |
| JP | 2001-119057 A | 4/2001 |
| JP | 2001144313 A | 5/2001 |
| JP | 2004-031445 A | 1/2004 |
| JP | 2005-034913 | 2/2005 |
| JP | 2005-064266 | 3/2005 |
| JP | 2005-0064268 | 3/2005 |
| JP | 2006-032308 A | 2/2006 |
| JP | 2006-036874 A | 2/2006 |
| JP | 2006-036875 A | 2/2006 |
| JP | 2006-036876 A | 2/2006 |
| JP | 2006-186237 A | 7/2006 |
| JP | 2006-190865 A | 7/2006 |
| JP | 2006-190867 A | 7/2006 |
| WO | 2006/085603 A1 | 8/2006 |
| WO | 2006/095762 A1 | 9/2006 |

OTHER PUBLICATIONS

U.S. Appl. No. 12/012,891 (2008).*
U.S. Appl. No. 12/012,843 (2008).*
YourDictionary.com, laminate, http://www.yourdictionary.com/laminate (last retrieved Jul. 14, 2010).*
U.S. Appl. No. 11/566,628, filed Oct. 27, 2006.
U.S. Appl. No. 11/704,013, filed Feb. 7, 2007.
U.S. Appl. No. 11/633,256, filed Dec. 4, 2006.
U.S. Appl. No. 11/491,341, filed Jul. 21, 2006.
U.S. Appl. No. 11/512,825, filed Jun. 30, 2006.
U.S. Appl. No. 11/495,391, filed Jul. 28, 2008.
U.S. Appl. No. 11/705,196, filed Feb. 12, 2007.
U.S. Appl. No. 11/495,249, filed Jul. 28, 2006.
U.S. Appl. No. 60/901,367, filed Feb. 15, 2007.
U.S. Appl. No. 60/901,510, filed Feb. 15, 2007.
U.S. Appl. No. 11/796,755, filed Apr. 30, 2007.
U.S. Appl. No. 11/366,143, filed Mar. 21, 2006.
Baum et al., "Solar Collectors—Final Report", Jun. 1983, DOE/CS/35359-T1 (DE84011480), DOE6081.1, Contract AC4-78CS35359, Springborn Laboratories, Enfield, Connecticut.
DuPont Encapsulation Offerings—Elvax® EVA & Surlyn® Resins (2006).
DuPont Encapsulation Offerings—SentryGlas® Interlayer (2006).
DuPont Encapsulation Offerings—SentryGlas® PVB Interlayer (2006).

(Continued)

Primary Examiner — Jeffrey T Barton
Assistant Examiner — Magali P Slawski

(57) ABSTRACT

The present invention provides a solar cell pre-laminate assembly comprising one or more solar cells laminated between two compositionally distinct encapsulant layers, and the method of preparing a solar cell module from such an assembly.

18 Claims, No Drawings

OTHER PUBLICATIONS

Technical Information—Data Sheet Elvax® PV1400 (1995-2007).
Technical Information—Data Sheet Elvax® PV1410 (1995-2007).
Technical Information—Data Sheet Elvax® PV1600 (1995-2007).
Technical Information—Data Sheet—Elvax® PV1650 (1995-2007).
Photovoltaic Solutions—What Does DuPont Bring? (2006).
Tedlar® PVF Films—Industry standard in photovoltaic backsheets for over 20 years (2006).
DuPont Teijin Films™—Manufacture of PET and PEN Polyester Films (2006).
DuPont™ SentryGlas® Plus Brochure (2005).
DuPont™ SentryGlas® Plus Technical Bulletin Strength Characteristics (2005).
DuPont™ SentryGlas® Plus Technical Bulletin Weathering (2005).
DuPont™ SentryGlas® Plus Technical Bulletin Sealant Compatibility (2005).
DuPont™ SentryGlas® Plus Technical Bulletin Visual Quality (2005).
Product Brochure: DuPont™ Butacite® polyvinyl butyral (PVB) interlayer (2006).
DuPont™ SentryGlas® Acoustic™ Brochure (2004).
U.S. Appl. No. 11/462,359, filed Aug. 3, 2006.

* cited by examiner

SOLAR CELL MODULES COMPRISING COMPOSITIONALLY DISTINCT ENCAPSULANT LAYERS

FIELD OF THE INVENTION

The present invention relates to solar cell modules comprising a solar cell component encapsulated by compositionally distinct encapsulant materials.

BACKGROUND OF THE INVENTION

As a renewable energy resource, the use of solar cell modules is rapidly expanding. One preferred way of manufacturing a solar cell module involves forming a pre-laminate assembly comprising at least 5 structural layers. The solar cell pre-laminates are constructed in the following order starting from the top, or incident layer (that is, the layer first contacted by light) and continuing to the backing (the layer furthest removed from the incident layer): (1) incident layer (typically a glass plate or a thin polymeric film (such as a fluoropolymer or polyester film), but could conceivably be any material that is transparent to sunlight), (2) front encapsulant layer, (3) voltage-generating component (or solar cell component), (4) back encapsulant layer, and (5) backing layer.

The encapsulant layers are designed to encapsulate and protect the fragile voltage-generating component. Generally, a solar cell pre-laminate will incorporate at least two encapsulant layers sandwiched around the solar cell component. The optical properties of the front encapsulant layer must be such that light can be effectively transmitted to the solar cell component.

Until recently, poly(vinyl butyral) (PVB) and ethylene vinyl acetate (EVA) have generally been chosen as the materials for the encapsulant layers. However, none of these encapsulant layer materials encompass all of the end-use requirements. For example, poly(vinyl butyral) compositions often posses high moisture absorption, while ethylene vinyl acetate compositions, on the other hand, suffer the shortcomings of low adhesion to the other components incorporated within the solar cell module, low creep resistance during the lamination process and end-use and low weathering and light stability. These shortcomings have generally been overcome through the formulation of adhesion primers, peroxide curing agents, and thermal and UV stabilizer packages into the compositions, which necessarily complicates the sheet production and ensuing lamination processes.

A more recent development has been the use of higher modulus ethylene copolymers having acid functionality and ionomers derived therefrom in solar cell structures. See, e.g., U.S. Pat. No. 5,476,553; U.S. Pat. No. 5,478,402; U.S. Pat. No. 5,733,382; U.S. Pat. No. 5,741,370; U.S. Pat. No. 5,762,720; U.S. Pat. No. 5,986,203; U.S. Pat. No. 6,114,046; U.S. Pat. No. 6,353,042; U.S. Pat. No. 6,320,116; U.S. Pat. No. 6,690,930; US 2003/0000568; and US 2005/0279401. However, although the ionomer compositions have excellent weatherability and adhesion to other solar cell laminate layers (e.g., glass), they tend to be high modulus and therefore fail to provide adequate shock absorbance.

There is a need to provide tailored encapsulant layers that fulfill all the end-use requirements.

SUMMARY OF THE INVENTION

The invention is directed to a solar cell pre-laminate assembly comprising (i) a solar cell component comprising one or a plurality of solar cells and having a light-receiving side and a back side, (ii) a first encapsulant layer comprising an ionomeric composition that comprises an ionomeric copolymer of an alpha olefin and greater than or equal to about 1 wt % of an alpha,beta-ethylenically unsaturated carboxylic acid having 3 to 8 carbons, based on the total weight of the ionomeric copolymer, wherein the carboxylic acid is neutralized to a level of 1 to 100 mol % with one or more metal ions, based on the total number of moles of carboxylate groups in the ionomeric copolymer, and (iii) a second encapsulant layer comprising a non-ionomeric polymeric composition, wherein the first and second encapsulant layers are positioned next to opposite sides of the solar cell component. Preferably, the ionomeric composition comprises about 1 to about 30 wt % of the alpha,beta-ethylenically unsaturated carboxylic acid, based on the total weight of the ionomeric copolymer. Yet preferably, the one or a plurality of solar cells are selected from the group consisting of multi-crystalline solar cells, thin film solar cells, compound semiconductor solar cells, and amorphous silicon solar cells.

In a particular embodiment, the first encapsulant layer is positioned next to the light-receiving side of the solar cell component and the second encapsulant layer is positioned next to the back side of the solar cell component.

In a further embodiment, non-ionomeric polymeric composition comprises a polymer selected from the group consisting of ethylene vinyl acetates (EVA), poly(vinyl acetal), thermoplastic polyurethanes (TPU), polyvinylchlorides (PVC), polyethylenes, polyolefin block elastomers, ethylene acrylate ester copolymers, acid copolymers, silicone elastomers and epoxy resins.

In a yet further embodiment, the solar cell pre-laminate assembly further comprises an incident layer laminated to the outer surface of the encapsulant layer that is laminated to the light-receiving side of the solar cell component, and a backing layer laminated to the outer surface of the encapsulant layer that is laminated to the back side of the solar cell component.

In a yet further embodiment, the solar cell pre-laminate assembly further comprises an incident layer laminated to the outer surface of the first encapsulant layer and a backing layer laminated to the outer surface of the second encapsulant layer. Preferably, the incident layer is formed of transparent material selected from the group consisting of glass and fluoropolymers and the backing layer is formed of a sheet or film selected from the group consisting of glass, plastic sheets or films, and metal sheets or films.

The invention is further directed to a solar cell pre-laminate assembly consisting essentially of, from top to bottom, (i) an incident layer that is positioned next to, (ii) a front encapsulant layer that is positioned next to, (iii) a solar cell layer comprising one or a plurality of solar cells, which is laminated to, (iv) a back encapsulant layer that is positioned next to, (v) a backing layer, wherein (a) one of the two encapsulant layers comprises an ionomeric copolymer of an alpha olefin and greater than or equal to about 1 wt % of an alpha,beta-ethylenically unsaturated carboxylic acid having 3 to 8 carbons, based on the total weight of the ionomeric copolymer, and wherein the carboxylic acid is neutralized to a level of 1 to 100 mol %, with one or more metal ions, based on the total number of moles of carboxylate groups in the ionomeric copolymer, and (b) the other of the two encapsulant layers comprises a non-ionomeric polymeric composition.

The invention is yet further directed to a process of manufacturing a solar cell module comprising: (i) providing a solar cell pre-laminate assembly as described above and (ii) laminating the assembly to form the solar cell module. Preferably, the lamination is conducted by subjecting the assembly to heat and optionally further to vacuum.

DETAILED DESCRIPTION OF THE INVENTION

All publications, patent applications, patents, and other documents mentioned herein are incorporated by reference in their entirety. Unless otherwise defined, all technical and scientific terms used herein have the same meaning as commonly understood by one of ordinary skill in the art to which this invention belongs. In case of conflict, the present specification, including definitions, will control.

Although methods and materials similar or equivalent to those described herein can be used in the practice or testing of the invention, suitable methods and materials are described herein.

Unless stated otherwise, all percentages, parts, ratios, etc., are by weight.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

When the term "about" is used in describing a value or an end-point of a range, the disclosure should be understood to include the specific value or end-point referred to.

As used herein, the terms "comprises," "comprising," "includes," "including," "containing," "characterized by," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The transitional phrase "consisting of" excludes any element, step, or ingredient not specified in the claim, closing the claim to the inclusion of materials other than those recited except for impurities ordinarily associated therewith. When the phrase "consists of" appears in a clause of the body of a claim, rather than immediately following the preamble, it limits only the element set forth in that clause; other elements are not excluded from the claim as a whole.

The transitional phrase "consisting essentially of" limits the scope of a claim to the specified materials or steps and those that do not materially affect the basic and novel characteristic(s) of the claimed invention. "A 'consisting essentially of' claim occupies a middle ground between closed claims that are written in a 'consisting of' format and fully open claims that are drafted in a 'comprising' format."

Where applicants have defined an invention or a portion thereof with an open-ended term such as "comprising," it should be readily understood that (unless otherwise stated) the description should be interpreted to also describe such an invention using the terms "consisting essentially of" or "consisting of."

Use of "a" or "an" are employed to describe elements and components of the invention. This is done merely for convenience and to give a general sense of the invention. This description should be read to include one or at least one and the singular also includes the plural unless it is obvious that it is meant otherwise.

In describing certain polymers it should be understood that sometimes applicants are referring to the polymers by the monomers used to make them, the amounts of the monomers used to make them, or by the monomer residues incorporated within them. While such a description may not include the specific nomenclature used to describe the final polymer or may not contain product-by-process terminology, any such reference to monomers, monomer residues, repeat units, and amounts should be interpreted to mean that the polymer is made from those monomers or that amount of the monomers, and the corresponding polymers and compositions thereof. In this regard, a reference to a copolymer containing residues of a monomer is referring to the fact that the copolymer contains repeat units from that monomer. When applicants refer to a copolymer containing a percentage of a monomer, it should be understood that this reference is to the copolymer containing repeat units from that monomer.

In describing and/or claiming this invention, the term "copolymer" is used to refer to polymers containing two or more monomers.

Solar Cell Pre-laminate Assemblies

The invention is directed to a solar cell pre-laminate assembly comprising a solar cell component that is formed of one or a plurality of solar cells and having a light-receiving side and a back side, and wherein the solar cell component is encapsulated by a first encapsulant layer comprising an ionomeric composition and a second encapsulant layer comprising a non-ionomer polymeric composition. Preferably, the solar cells used herein are electronically interconnected. More preferably, the ionomeric first encapsulant layer is positioned next to the light-receiving side of the solar cell component while the non-ionomeric second encapsulant layer is positioned next to the back side of the solar cell component.

I. Solar Cells:

The "solar cell(s)" is meant to include any article which can convert light into electrical energy. Typical art examples of the various forms of solar cells include, e.g., single crystal silicon solar cells, polycrystal silicon solar cells, microcrystal silicon solar cells, amorphous silicon based solar cells, copper indium selenide solar cells, compound semiconductor solar cells, dye sensitized solar cells, and the like. The most common types of solar cells are multi-crystalline solar cells, thin film solar cells, compound semiconductor solar cells, and amorphous silicon solar cells. By way of example, thin film solar cells are disclosed in U.S. Pat. No. 5,512,107; U.S. Pat. No. 5,948,176; U.S. Pat. No. 5,994,163; U.S. Pat. No. 6,040,521; U.S. Pat. No. 6,137,048; and U.S. Pat. No. 6,258,620.

II. Encapsulant Layers:

In accordance to the invention, the first encapsulant layer of the solar cell pre-laminate assembly is formed of an ionomer. "ionomers" as used herein are derived from certain parent acid copolymers. The parent acid copolymers are copolymers of alpha-olefins and alpha,beta-ethylenically unsaturated carboxylic acids having 3 to 8 carbons. The parent acid copolymers typically contains greater than or equal to about 1 wt % of alpha,beta-ethylenically unsaturated carboxylic acids based on the total weight of the copolymers. Preferably, the parent acid copolymers contain greater than or equal to about 10 wt %, or more preferably, about 15 to about 25 wt %, or yet more preferably, about 18 to about 23 wt %, of alpha,beta-ethylenically unsaturated carboxylic acids based on the total weight of the copolymers.

The alpha olefins used herein may incorporate 2 to 10 carbon atoms. Preferably, the alpha olefins are selected from the group consisting of ethylene, propylene, 1-butene, 1-pentene, 1-hexene, 1-heptene, 3-methyl-1-butene, 4-methyl-1-pentene, and the like and mixtures thereof. More preferably, the alpha olefin is ethylene. The alpha,beta-ethylenically unsaturated carboxylic acids used herein may include, but are not limited to, acrylic acid, methacrylic acid, itaconic acid, maleic acid, maleic anhydride, fumaric acid, monomethyl maleic acid, and mixtures thereof. Preferably, the alpha,beta ethylenically unsaturated carboxylic acids are selected from the group consisting of acrylic acids, methacrylic acids, and mixtures thereof.

The parent acid copolymers may further contain other unsaturated comonomers. Specific examples of the other unsaturated comonomers include, but are not limited to, methyl acrylate, methyl methacrylate, ethyl acrylate, ethyl methacrylate, propyl acrylate, propyl methacrylate, isopropyl acrylate, isopropyl methacrylate, butyl acrylate, butyl methacrylate, isobutyl acrylate, isobutyl methacrylate, tert-butyl acrylate, tert-butyl methacrylate, octyl acrylate, octyl methacrylate, undecyl acrylate, undecyl methacrylate, octadecyl acrylate, octadecyl methacrylate, dodecyl acrylate, dodecyl methacrylate, 2-ethylhexyl acrylate, 2-ethylhexyl methacrylate, isobornyl acrylate, isobornyl methacrylate, lauryl acrylate, lauryl methacrylate, 2-hydroxyethyl acrylate, 2-hydroxyethyl methacrylate, glycidyl acrylate, glycidyl methacrylate, poly(ethylene glycol)acrylate, poly(ethylene glycol)methacrylate, poly(ethylene glycol) methyl ether acrylate, poly(ethylene glycol) methyl ether methacrylate, poly(ethylene glycol) behenyl ether acrylate, poly(ethylene glycol) behenyl ether methacrylate, poly(ethylene glycol) 4-nonylphenyl ether acrylate, poly(ethylene glycol) 4-nonylphenyl ether methacrylate, poly(ethylene glycol) phenyl ether acrylate, poly(ethylene glycol) phenyl ether methacrylate, dimethyl maleate, diethyl maleate, dibutyl maleate, dimethyl fumarate, diethyl fumarate, dibutyl fumarate, dimenthyl fumarate, vinyl acetate, vinyl propionate, and the like and mixtures thereof. Preferably, the other unsaturated comonomers are selected from the group consisting of methyl acrylate, methyl methacrylate, butyl acrylate, butyl methacrylate, glycidyl methacrylate, vinyl acetate, and mixtures thereof. The parent acid copolymers may incorporate, up to about 50 wt %, or preferably, up to about 30 wt %, or more preferably, up to about 20 wt %, of the other unsaturated comonomers, based on the total weight of the copolymers.

The parent acid copolymers may be polymerized as disclosed, for example, in U.S. Pat. No. 3,404,134; U.S. Pat. No. 5,028,674; U.S. Pat. No. 6,500,888; and U.S. Pat. No. 6,518,365.

To obtain the ionomers, the parent acid copolymers are partially or fully neutralized with metallic ions. Preferably, the parent acid copolymers are about 10% to about 100%, or more preferably, about 10% to about 50%, or yet more preferably, about 20% to about 40%, neutralized with metallic ions, based on the total number of moles of carboxylate groups in the ionomeric copolymer. The metallic ions may be monovalent, divalent, trivalent, multivalent, and mixtures thereof. Preferable monovalent metallic ions include, but are not limited to, sodium, potassium, lithium, silver, mercury, copper, and the like and mixtures thereof. Preferable divalent metallic ions include, but are not limited to, beryllium, magnesium, calcium, strontium, barium, copper, cadmium, mercury, tin, lead, iron, cobalt, nickel, zinc, and the like and mixtures thereof. Preferable trivalent metallic ions include, but are not limited to, aluminum, scandium, iron, yttrium, and the like and mixtures thereof. Preferable multivalent metallic ions include, but are not limited to, titanium, zirconium, hafnium, vanadium, tantalum, tungsten, chromium, cerium, iron, and the like and mixtures thereof. It is preferred that when the metallic ion is multivalent, complexing agents, such as stearate, oleate, salicylate, and phenolate radicals are included, as disclosed in U.S. Pat. No. 3,404,134. More preferably, the metallic ions are selected from the group consisting of sodium, lithium, magnesium, zinc, aluminum, and mixtures thereof. Yet more preferably, the metallic ions are selected from the group consisting of sodium, zinc, and mixtures thereof. Most preferably, the metallic ion is zinc. The parent acid copolymers may be neutralized as disclosed, for example, in U.S. Pat. No. 3,404,134.

To reduce resin creep (flow) during the lamination process and within the end-use, the ionomers may have a melt index (MI) of, less than about 10 g/10 min, or preferably, less than about 5 g/10 min, or more preferably, less than about 3 g/10 min, as measured at 190° C. by ASTM method D1238. Moreover, the ionomers may have a flexural modulus, greater than about 40,000 psi, or preferably, greater than about 50,000 psi, or yet more preferably, greater than about 60,000 psi, as measured by ASTM method D638.

Additionally, to provide the ionomer resins with improved toughness, they are typically prepared from parent acid copolymers having a MI of, less than 60 g/10 min, or preferably, less than about 55 g/10 min, or more preferably, less than about 50 g/10 min, or yet more preferably, less than about 35 g/10 min, as determined at 190° C.

Also in accordance to the invention, any suitable non-ionomer polymeric compositions may be used to form the second encapsulant layer. For instance, the second encapsulant layer may be formed of any material selected from the group consisting of acid copolymers of alpha-olefins and alpha,beta-ethylenically unsaturated carboxylic acids, ethylene vinyl acetate (EVA), poly(vinyl acetal) (e.g., poly(vinyl butyral) (PVB), including acoustic grades of poly(vinyl acetal)), thermoplastic polyurethane (TPU), poly vinyl chloride (PVC), polyethylenes (e.g., metallocene-catalyzed linear low density polyethylenes), polyolefin block elastomers, ethylene acrylate ester copolymers (e.g., poly(ethylene-co-methyl acrylate) and poly(ethylene-co-butyl acrylate)), silicone elastomers, epoxy resins, and mixtures thereof. Preferably, the second encapsulant layer is formed of any material selected from the group consisting of acid copolymers of alpha-olefins and alpha,beta-ethylenically unsaturated carboxylic acids, ethylene vinyl acetate, poly(vinyl butyral), metallocene-catalyzed linear low density polyethylenes, ethylene acrylate ester copolymers, and any mixtures thereof.

In one embodiment, the second encapsulant layer is formed of a composition comprising poly(ethylene-co-vinyl acetate), which may be obtained from the Bridgestone Corporation, Nashville, Tenn., the Exxon Corporation, Houston, Tex., and E. I. du Pont de Nemours and Company, Wilmington, Del. ("DuPont"). The poly(ethylene-co-vinyl acetate) composition preferably contains about 10 to about 50 wt %, or more preferably, about 20 to about 40 wt %, or most preferably, about 25 to about 35 wt %, of comonomer vinyl acetate, based on the total weight of the composition. The poly(ethylene-co-vinyl acetate) compositions may also contain up to about 50 wt %, or preferably, up to about 25 wt %, of other unsaturated comonomers, based on the total weight of the composition. Specific examples of suitable other unsaturated comonomers include, but are not limited to, methyl acrylate, methyl methacrylate, ethyl acrylate, ethyl methacrylate, propyl acrylate, propyl methacrylate, isopropyl acrylate, isopropyl methacrylate, butyl acrylate, butyl methacrylate, isobutyl acrylate, isobutyl methacrylate, tert-butyl acrylate, tert-butyl methacrylate, octyl acrylate, octyl methacrylate, undecyl acrylate, undecyl methacrylate, octadecyl acrylate, octadecyl methacrylate, dodecyl acrylate, dodecyl methacrylate, 2-ethylhexyl acrylate, 2-ethylhexyl methacrylate, isobornyl acrylate, isobornyl methacrylate, lauryl acrylate, lauryl methacrylate, 2-hydroxyethyl acrylate, 2-hydroxyethyl methacrylate, glycidyl acrylate, glycidyl methacrylate, poly(ethylene glycol) acrylate, poly(ethylene glycol)methacrylate, poly(ethylene glycol) methyl ether acrylate, poly(ethylene glycol) methyl ether methacrylate, poly(ethylene glycol) behenyl ether acrylate, poly(ethylene glycol) behenyl ether methacrylate, poly(ethylene glycol) 4-nonylphenyl ether acrylate, poly(ethylene glycol) 4-nonylphenyl ether methacrylate, poly(ethylene glycol) phenyl ether acrylate, poly(ethylene glycol) phenyl ether methacrylate, dimethyl maleate, diethyl maleate, dibutyl maleate, dimethyl fumarate, diethyl fumarate, dibutyl fumarate, dimenthyl fumarate, vinyl propionate, acrylic acid, methacrylic acid, fumaric acid, maleic acid, maleic anhydride and the like and mixtures thereof.

As an encapsulant material in solar cell modules, plasticizers may be further added into the poly(ethylene-co-vinyl acetate) compositions. Examples of the useful plasticizers include, but are not limited to, polybasic acid esters and polyhydric alcohol esters, such as dioctyl phthalate, dihexyladipate, triethylene glycol-di-2-ethylbutylate, butyl sebacate, tetraethylene glycol heptanoate, triethylene glycol dipelargonate and the like and mixtures thereof. In general, the plasticizer level in the poly(ethylene-co-vinyl acetate) composition should not exceed about 5 wt %, based on the total weight of the composition.

The poly(ethylene-co-vinyl acetate) compositions may also contain an organic peroxide. Preferably, the organic peroxide level ranges from about 0.1 to about 5 wt %, based on the total weight of the composition.

Alternatively, the poly(ethylene-co-vinyl acetate) composition may be cured by light. In this instance, the organic peroxide may be replaced with a photoinitiator or photosensitizer. Preferably, the level of the photoinitiator ranges from about 0.1 to about 5 wt %, based on the total weight of the composition. Specific examples of the preferred photoinitiator include, but are not limited to, benzoin, benzophenone, benzoyl methyl ether, benzoin ethyl ether, benzoin isopropyl ether, benzoin isobutyl ether, dibenzyl, 5-nitroacenaphtene, hexachlorocyclopentadiene, p-nitrodiphenyl, p-nitroaniline, 2,4,6-trinitroaniline, 1,2-benzanthraquinone, 3-methyl-1,3-diaza-1,9-benzanthrone and the like and mixtures thereof.

The poly(ethylene-co-vinyl acetate) compositions may further incorporate materials which contain acryloyl(oxy) group containing compounds, methacryloyl(oxy) group containing compounds and/or epoxy group containing compounds for improvement or adjustment of various properties of the resin, such as, e.g., mechanical strength, adhesive properties, optical characteristics, heat resistance, light-resistance, rate of crosslinking and the like. These materials are preferably used at a level of about 50 wt % or less, or more preferably, about 10 wt % or less, or most preferably, about 0.1 to about 2 wt %, based on the total weight of the composition. Examples of the acryloyl(oxy) and methacryloyl(oxy) group containing compounds include, but are not limited to, derivatives of acrylic acid or methacrylic acid, such as esters, and amides of acrylic acid or methacrylic acid. Examples of the ester residue include linear alkyl groups (e.g., methyl, ethyl, dodecyl, stearyl and lauryl), a cyclohexyl group, a tetrahydrofurfuryl group, an aminoethyl group, a 2-hydroxyethyl group, a 3-hydroxypropyl group, 3-chloro-2-hydroxypropyl group. Further, the esters include esters of acrylic acid or methacrylic acid with polyhydric alcohol such as ethylene glycol, triethylene glycol, polypropylene glycol, polyethylene glycol, trimethylol propane or pentaerythritol. An example of the amide includes diacetone acrylamide. Examples of polyfunctional compounds include esters of plural acrylic acids or methacrylic acids with polyhydric alcohol such as glycerol, trimethylol propane or pentaerythritol. Examples of the epoxy group containing compounds include triglycidyl tris(2-hydroxyethyl)isocyanurate, neopentylglycol diglycidyl ether, 1,6-hexanediol diglycidyl ether, allyl glycidyl ether, 2-ethylhexyl glycidyl ether, phenyl glycidyl ether, phenol(ethyleneoxy)sub-5 glycidyl ether, p-tert-butylphenyl glycidyl ether, diglycidyl adipate, diglycidyl phthalate, glycidyl methacrylate and butyl glycidyl ether, and the like and mixtures thereof.

In a further embodiment, an acoustic poly(vinyl acetal) composition comprising a poly(vinyl acetal) and one or more plasticizers may be used in forming the second encapsulant layer.

One preferred acoustic poly(vinyl acetal) composition has been disclosed in U.S. Pat. No. 5,190,826, which is incorporated herein by reference. In this particular embodiment, the poly(vinyl acetal) is obtained by acetalizing a polyvinyl alcohol with an aldehyde having 6 to 8 carbons atoms and has a degree of acetalization of at least 50%. Preferred polyvinyl alcohols are those having an average polymerization degree of about 1000 to about 3000 and a saponification degree of at least about 95 mol %. The aldehydes may include aliphatic, aromatic or alicyclic aldehydes. Specific examples of aldehydes include n-hexylaldehyde, 2-ethylbutyraldehyde, n-heptylaldehyde, n-octylaldehyde, n-nonylaldehyde, n-decylaldehyde, benzaldehyde, and cinnamaldehyde. In addition, the poly(vinyl acetal) composition further comprises a plasticizer at a level of about 20 to about 60 weight parts for 100 weight parts of the poly(vinyl acetal). The plasticizers used herein may be monobasic acid esters, polybasic esters or like organic plasticizers, or organic phosphate or organic phosphite plasticizers.

A more preferred acoustic poly(vinyl acetal) composition is disclosed in U.S. Pat. No. 5,340,654, which is incorporated herein by reference. In this particular embodiment, the poly(vinyl acetal) is obtained by acetalizing a polyvinyl alcohol with an aldehyde having 4 to 6 carbon atoms and the average of the residual acetyl group amount is limited to within the range of about 8 to about 30 mol %. Preferred polyvinyl alcohols are those having an average polymerization degree of about 500 to about 3000, or more preferably, about 1000 to about 2500. Preferred aldehydes may include n-butyl aldehyde, isobutyl aldehyde, valer aldehyde, n-hexyl aldehyde, and 2-ethylbutyl aldehyde. The plasticizer(s) are comprised in the composition at a level of about 30 to about 70 weight parts for 100 weight parts of the poly(vinyl acetal). The plasticizers used herein may be monobasic acid esters, polybasic esters or like organic plasticizers, or organic phosphate or organic phosphite plasticizers A yet more preferred acoustic poly(vinyl acetal) composition is an acoustic poly(vinyl butyral) composition disclosed in US 2006008648, which is incorporated herein by reference. In this particular embodiment, the acoustic poly(vinyl butyral) composition comprises a poly(vinyl butyral) having a hydroxyl number (OH number) of about 17 to about 23 and a single plasticizer in an amount of about 40 to about 50 parts per hundreds. The plasticizer used here may be any plasticizer that is conventional for use with poly(vinyl butyral).

In a yet further embodiment, any suitable conventionally plasticized poly(vinyl butyral) compositions may be used to form the second encapsulant layer. The poly(vinyl butyral) used herein will typically have a weight average molecular weight of about 30,000 to about 600,000, or preferably, about 45,000 to about 300,000, or more preferably, about 200,000 to about 300,000, as measured by size exclusion chromatography using low angle laser light scattering. The poly(vinyl butyral) may also comprise about 5 to about 30 wt %, or preferably, about 11 to about 25 wt %, or more preferably, about 13 to about 22 wt %, of hydroxyl groups calculated as polyvinyl alcohol (PVOH), and up to about 10 wt %, or preferably, up to about 3 wt %, of residual ester groups. The poly(vinyl butyral) may further comprise a minor amount of acetal groups other than butyral, for example, 2-ethyl hexanal, as disclosed within U.S. Pat. No. 5,137,954.

Plasticizers that are admixed with the poly(vinyl butyral) may be any conventional plasticizers, such as those disclosed in U.S. Pat. No. 3,841,890; U.S. Pat. No. 4,144,217; U.S. Pat. No. 4,276,351; U.S. Pat. No. 4,335,036; U.S. Pat. No. 4,902,464; U.S. Pat. No. 5,013,779; and WO 96/28504. Particularly suitable plasticizers include, but are not limited to, triethylene glycol di-(2-ethyl butyrate), triethylene glycol di-2-ethylhexanoate, triethylene glycol di-n-heptanoate, oligoethylene glycol di-2-ethylhexanoate, tetraethylene glycol di-n-heptanoate, dihexyl adipate, dioctyl adipate, mixtures of heptyl and nonyl adipates, dibutyl sebacate, tributoxyethylphosphate, isodecylphenylphosphate, triisopropylphosphite, polymeric plasticizers such as the oil-modified sebacid alkyds, mixtures of phosphates and adipates and alkyl benzyl phthalates. In general, about 15 to about 80 parts per hundreds, or preferably, about 25 to about 45 parts per hundreds, of the plasticizer are used. This latter concentration is generally used with those poly(vinyl butyral) compositions containing 17 to 25 wt % of vinyl alcohol.

An adhesion control additive for controlling the adhesive bond between the encapsulant layer and other glass rigid sheets, may also be comprised in the poly(vinyl butyral) compositions. These are generally alkali metal or alkaline earth metal salts of organic and inorganic acids. Preferably, they are alkali metal or alkaline earth metal salts of organic carboxylic acids having from 2 to 16 carbon atoms. More preferably, they are magnesium or potassium salts of organic carboxylic acids having from 2 to 16 carbon atoms. Specific examples of the adhesion control additives include, but are not limited to, potassium acetate, potassium formate, potassium propanoate, potassium butanoate, potassium pentanoate, potassium hexanoate, potassium 2-ethylbutylate, potassium heptanoate, potassium octanoate, potassium 2-ethylhexanoate, magnesium acetate, magnesium formate, magnesium propanoate, magnesium butanoate, magnesium pentanoate, magnesium hexanoate, magnesium 2-ethylbutylate, magnesium heptanoate, magnesium octanoate, magnesium 2-ethylhexanoate and the like and mixtures thereof. The adhesion control additives are typically at a level of about 0.001 to about 0.5 wt %, based on the total weight of the composition. Other additives, such as antioxidants, ultraviolet absorbers, ultraviolet stabilizers, thermal stabilizers, colorants and the like, such as those described in U.S. Pat. No. 5,190,826, may also be comprised in the plasticized poly(vinyl butyral) compositions.

In a yet further embodiment, the second encapsulant layers are formed of ethylene acrylate ester copolymers, which include, but are not limited to, methyl acrylate, methyl methacrylate, ethyl acrylate, ethyl methacrylate, propyl acrylate, propyl methacrylate, isopropyl acrylate, isopropyl methacrylate, butyl acrylate, butyl methacrylate, isobutyl acrylate, isobutyl methacrylate, tert-butyl acrylate, tert-butyl methacrylate, octyl acrylate, octyl methacrylate, undecyl acrylate, undecyl methacrylate, octadecyl acrylate, octadecyl methacrylate, dodecyl acrylate, dodecyl methacrylate, 2-ethylhexyl acrylate, 2-ethylhexyl methacrylate, isobornyl acrylate, isobornyl methacrylate, lauryl acrylate, lauryl methacrylate, 2-hydroxyethyl acrylate, 2-hydroxyethyl methacrylate, glycidyl acrylate, glycidyl methacrylate, poly(ethylene glycol) acrylate, poly(ethylene glycol)methacrylate, poly(ethylene glycol) methyl ether acrylate, poly(ethylene glycol) methyl ether methacrylate, poly(ethylene glycol) behenyl ether acrylate, poly(ethylene glycol) behenyl ether methacrylate, poly(ethylene glycol) 4-nonylphenyl ether acrylate, poly(ethylene glycol) 4-nonylphenyl ether methacrylate, poly(ethylene glycol) phenyl ether acrylate, poly(ethylene glycol) phenyl ether methacrylate, dimethyl maleate, diethyl maleate, dibutyl maleate, dimethyl fumarate, diethyl fumarate, dibutyl fumarate, dimenthyl fumarate, and the like and combinations thereof. Preferable acrylate ester comonomers include, but are not limited to, methyl acrylate, ethyl acrylate, isopropyl acrylate, butyl acrylate and combinations thereof. Preferably, the ethylene acrylate ester copolymers used herein incorporate about 1 and about 60 wt %, or more preferably, about 10 and about 45 wt %, or yet more preferably, about 15 and about 35 wt %, of the acrylate ester comonomer, based on the total weight of the composition.

It is understood that any of the polymeric compositions described above may further contain additive(s) which effectively reduce the melt flow of the resin, to the limit of producing thermoset films or sheets. The use of such additives will enhance the upper end-use temperature and reduce creep of the solar cell encapsulant layers both during the lamination process and the end-uses thereof. Typically, the end-use temperature will be enhanced up to about 20° C. to about 70° C. In addition, laminates produced from such materials will be fire resistant. By reducing the melt flow of the compositions, the material will have a reduced tendency to melt and flow out of the laminate and therefore less likely to serve as additional fire fuel. Specific examples of melt flow reducing additives include, but are not limited to, organic peroxides, such as 2,5-dimethylhexane-2,5-dihydroperoxide, 2,5-dimethyl-2,5-di(tert-betylperoxy)hexane-3, di-tert-butyl peroxide, tert-butylcumyl peroxide, 2,5-dimethyl-2,5-di(tert-butylperoxy) hexane, dicumyl peroxide, alpha,alpha'-bis(tert-butylperoxyisopropyl)benzene, n-butyl-4,4-bis(tert-butylperoxy) valerate, 2,2-bis(tert-butylperoxy)butane, 1,1-bis(tert-butylperoxy)cyclohexane, 1,1-bis(tert-butylperoxy)-3,3,5-trimethyl-cyclohexane, tert-butyl peroxybenzoate, benzoyl peroxide, and the like and mixtures or combinations thereof. The organic peroxide may decompose at a temperature of about 100° C. or higher to generate radicals. Preferably, the organic peroxides have a decomposition temperature which affords a half life of 10 hours at about 70° C. or higher to provide improved stability for blending operations. Typically, the organic peroxides will be added at a level of about 0.01 and about 10 wt % based on the total weight of composition. If desired, initiators, such as dibutyltin dilaurate, may be used. Typically, initiators are added at a level of about 0.01 to about 0.05 wt % based on the total weight of the composition. If desired, inhibitors, such as hydroquinone, hydroquinone monomethyl ether, p-benzoquinone, and methylhydroquinone, may be added for the purpose of enhancing control to the reaction and stability. Typically, the inhibitors would be added at a level of less than about 5 wt % based on the total weight of the composition. However, for the sake of process simplification and ease, it is preferred that the encapsulant layer used herein does not incorporate cross-linking additives, such as the abovementioned peroxides.

The polymeric compositions used herein may further contain any other additives known within the art. The other additives may include, but are not limited to, processing aides, flow enhancing additives, lubricants, pigments, dyes, flame retardants, impact modifiers, nucleating agents, anti-blocking agents such as silica, thermal stabilizers, UV absorbers, UV stabilizers, dispersants, surfactants, chelating agents, coupling agents, adhesives, primers, reinforcement additives, such as glass fiber, fillers and the like. Generally, additives that may reduce the optical clarity of the composition, such as reinforcement additives and fillers, are added only to the encapsulant layers that are positioned next to the back side of the solar cell component.

Thermal stabilizers can be used and have been widely disclosed within the art. Any known thermal stabilizer may find utility within the present invention. Preferable general classes of thermal stabilizers include, but are not limited to, phenolic antioxidants, alkylated monophenols, alkylthiomethylphenols, hydroquinones, alkylated hydroquinones, tocopherols, hydroxylated thiodiphenyl ethers, alkylidenebisphenols, O-, N- and S-benzyl compounds, hydroxybenzylated malonates, aromatic hydroxybenzyl compounds, triazine compounds, aminic antioxidants, aryl amines, diaryl amines, polyaryl amines, acylaminophenols, oxamides, metal deactivators, phosphites, phosphonites, benzylphosphonates, ascorbic acid (vitamin C), compounds that destroy peroxide, hydroxylamines, nitrones, thiosynergists, benzofuranones, indolinones, and the like and mixtures thereof. More preferably, the thermal stabilizer is a bis-phenolic antioxidant, which have been found to be surprisingly suitable for preparing low color poly(vinyl butyral), especially when used in combination with the triethylene glycol di-2-ethylhexanoate plasticizer. Suitable specific bis-phenolic antioxidants include 2,2'-ethylidenebis(4,6-di-t-butylphenol); 4,4'-butylidenebis(2-t-butyl-5-methylphenol); 2,2'-isobutylidenebis (6-t-butyl-4-methylphenol); and 2,2'-methylenebis(6-t-butyl-4-methylphenol). Bis-phenolic antioxidants are commercially available under the tradenames of Anox® 29, Lowinox® 22M46, Lowinox® 44B25, and Lowinox® 221B46 (Chemtura, Middlebury, Conn.). The polymeric compositions used herein may contain any effective amount of thermal stabilizers. Use of a thermal stabilizer is optional and in some instances is not preferred. When used, the polymeric compositions contain at least about 0.05 wt %, and up to about 10 wt %, more preferably up to about 5 wt %, and most preferably up to about 1 wt %, of thermal stabilizers, based on the total weight of the composition.

UV absorbers can be used and have also been widely disclosed within the art. Any known UV absorber may find utility within the present invention. Preferable general classes of UV absorbers include, but are not limited to, benzotriazoles, hydroxybenzophenones, hydroxyphenyl triazines, esters of substituted and unsubstituted benzoic acids, and the like and mixtures thereof. The polymeric compositions used herein may contain any effective amount of UV absorbers. Use of a UV absorber is optional and in some instances is not preferred. When used, the polymeric compositions contain at least about 0.05 wt %, and up to about 10 wt %, more preferably up to about 5 wt %, and most preferably up to about 1 wt %, of UV absorbers, based on the total weight of the composition.

Hindered amine light stabilizers (HALS) can be used and have also been widely disclosed within the art. Generally, Hindered amine light stabilizers are disclosed to be secondary, tertiary, acetylated, N-hydrocarbyloxy substituted, hydroxy substituted N-hydrocarbyloxy substituted, or other substituted cyclic amines which further incorporate steric hindrance, generally derived from aliphatic substitution on the carbon atoms adjacent to the amine function. The polymeric compositions used herein may contain any effective amount of hindered amine light stabilizers. Use of hindered amine light stabilizers is optional and in some instances is not preferred. When used, the polymeric compositions contain at least about 0.05 wt %, and up to about 10 wt %, more preferably up to about 5 wt %, and most preferably, up to about 1 wt %, of hindered amine light stabilizers, based on the total weight of the composition.

Additionally, silane coupling agents may be added into the polymeric compositions to enhance the adhesion strengths. Specific examples of the silane coupling agents include, but are not limited to, gamma-chloropropylmethoxysilane, vinyltriethoxysilane, vinyltris(beta-methoxyethoxy)silane, gamma-methacryloxypropylmethoxysilane, vinyltriacetoxysilane, gamma-glycidoxypropyltrimethoxysilane, gamma-glycidoxypropyltriethoxysilane, beta-(3,4-epoxycyclohexyl) ethyltrimethoxysilane, vinyltrichlorosilane, gamma-mercaptopropylmethoxysilane, gamma-aminopropyltriethoxysilane, N-beta-(aminoethyl)-gamma-aminopropyltrimethoxysilane, and the like and mixtures thereof. These silane coupling agent materials may be used at a level of about 5 wt % or less, or preferably, about 0.001 to about 5 wt %, based on the total weight of the resin composition.

Typically, the thickness of each of the solar cell encapsulant layers is independently ranging from about 1 mil (0.026 mm) to about 120 (3.00 mm). Preferably, the thickness of each of the two encapsulant layers ranges from 1 mil (0.026 mm) to about 40 mils (1.02 mm), or more preferably, from about 1 mil (0.026 mm) to about 20 mils (0.51 mm).

Moreover, the two encapsulant layers may have smooth or roughened surfaces. Preferably, the encapsulant layers have roughened surfaces to facilitate the de-airing of the laminates through the laminate process. It is understood, however, that the roughened surfaces of the encapsulant layers are smoothed after the lamination process.

III. Incident Layers, Backing Layers, and Other Layers:

The solar cell pre-laminate assembly disclosed herein may further comprise an incident layer and/or a backing layer serving as the outer layers of the assembly at the light-receiving side and the back side, respectively.

The outer layers of the solar cell pre-laminate assemblies, i.e., the incident layers and the backing layers, may be derived from any suitable sheets or films. Suitable sheets used herein may be glass or plastic sheets, such as, polycarbonate, acrylics, polyacrylate, cyclic polyolefins (e.g., ethylene norbornene polymers), metallocene-catalyzed polystyrene, polyamides, polyesters, fluoropolymers and the like and combinations thereof. In addition, metal sheets, such as aluminum, steel, galvanized steel, or ceramic plates may be utilized in forming the backing layers.

The term "glass" is meant to include not only window glass, plate glass, silicate glass, "sheet glass", low iron glass, tempered glass, tempered CeO-free glass, and float glass, but also includes colored glass, specialty glass which includes ingredients to control, e.g., solar heating, coated glass with, for example, sputtered metals, such as silver or indium tin oxide, for solar control purposes, E-glass, Toroglass, Solex® glass (Solutia, St. Louis, Mo.) and the like. Such specialty glasses are disclosed in, e.g., U.S. Pat. Nos. 4,615,989; 5,173, 212; 5,264,286; 6,150,028; 6,340,646; 6,461,736; and 6,468, 934. The type of glass to be selected for a particular laminate depends on the intended use. Of course, it should be readily recognized that glass is referring to sheets of glass.

Suitable film layers used herein may be polymeric. Preferred polymers used to form the polymeric films, include but are not limited to, polyesters (e.g., poly(ethylene terephthalate) (PET), poly(ethylene naphthalate), polycarbonate, polyolefins (e.g., polypropylene, polyethylene, and cyclic polyloefins), norbornene polymers, polystyrene (including syndiotactic polystyrene), styrene-acrylate copolymers, acrylonitrile-styrene copolymers, polysulfones (e.g., polyethersulfone, polysulfone, etc.), nylons, poly(urethanes), acrylics, cellulose acetates (e.g., cellulose acetate, cellulose triacetates, etc.) cellophane, vinyl chloride polymers (e.g., polyvinylidene chloride, vinylidene chloride copolymers, etc.), fluoropolymers (e.g., polyvinyl fluoride, polyvinylidene fluoride, polytetrafluoroethylene, ethylene-tetrafluoroethylene copolymers, etc.) and the like. Most preferably, the polymeric film is biaxially oriented polyester film (preferably PET film) or a fluoropolymer film (e.g., Tedlar®, Tefzel®, and Teflon® (DuPont)). Fluoropolymer-polyester-fluoropolymer ("TPT") films are also preferred for some applications. Metal films, such as aluminum foil may also be used herein as the backing layer.

The solar cell pre-laminate assembly, may optionally further comprise other functional film or sheet layers (e.g., dielectric layers or barrier layers) embedded within the assembly. Such functional layers may be derived from any of the above mentioned polymeric films or those that are coated with additional functional coatings. For example, PET films coated with a metal oxide coating, such as those disclosed within U.S. Pat. No. 6,521,825; U.S. Pat. No. 6,818,819 and EP 1 182 710, may function as oxygen and moisture barrier layers in the laminates.

If desired, a layer of non-woven glass fiber (scrim) may also be included in the solar cell laminates to facilitate de-airing during the lamination process or to serve as reinforcement for the encapsulant layer(s). The use of such scrim layers within solar cell laminates is disclosed within, e.g., U.S. Pat. No. 5,583,057; U.S. Pat. No. 6,075,202; U.S. Pat. No. 6,204,443; U.S. Pat. No. 6,320,115; U.S. Pat. No. 6,323,416; and EP 0 769 818.

IV. Adhesives and Primers:

When greater adhesion is desired, one or both surfaces of any of the layers within the solar cell pre-laminate assembly may be treated to enhance the adhesion to other layers. This treatment may take any form known within the art, including adhesives, primers (e.g., silanes), flame treatments (see, e.g. U.S. Pat. No. 2,632,921; U.S. Pat. No. 2,648,097; U.S. Pat. No. 2,683,894; and U.S. Pat. No. 2,704,382), plasma treatments (see, e.g., U.S. Pat. No. 4,732,814), electron beam treatments, oxidation treatments, corona discharge treatments, chemical treatments, chromic acid treatments, hot air treatments, ozone treatments, ultraviolet light treatments, sand blast treatments, solvent treatments, and the like and combinations thereof. For example, a thin layer of carbon may be deposited on one or both surfaces of a polymeric film through vacuum sputtering as disclosed in U.S. Pat. No. 4,865,711. Or, as disclosed in U.S. Pat. No. 5,415,942, a hydroxy-acrylic hydrosol primer coating that may serve as an adhesion-promoting primer for PET films.

In a particular embodiment, the adhesive may take the form of a coating. The thickness of the adhesive/primer coating may be less than 1 mil, or preferably, less than 0.5 mil, or more preferably, less than 0.1 mil. The adhesive may be any adhesive or primer known within the art. Specific examples of adhesives and primers useful in the present invention include, but are not limited to, gamma-chloropropylmethoxysilane, vinyltrichlorosilane, vinyltriethoxysilane, vinyltris(beta-methoxyethoxy)silane, gamma-methacryloxypropyltrimethoxysilane, beta-(3,4-epoxycyclohexyl)ethyltrimethoxysilane, gammaglycidoxypropyltrimethoxysilane, vinyltriacetoxysilane, gamma-mercaptopropyltrimethoxysilane, gamma-aminopropyltriethoxysilane, N beta-(aminoethyl)-gamma-aminopropyl-trimethoxysilane, glue, gelatin, caesin, starch, cellulose esters, aliphatic polyesters, poly(alkanoates), aliphatic-aromatic polyesters, sulfonated aliphatic-aromatic polyesters, polyamide esters, rosin/polycaprolactone triblock copolymers, rosin/poly(ethylene adipate) triblock copolymers, rosin/poly(ethylene succinate) triblock copolymers, poly(vinyl acetates), poly(ethylene-co-vinyl acetate), poly(ethylene-co-ethyl acrylate), poly(ethylene-co-methyl acrylate), poly(ethylene-co-propylene), poly(ethylene-co-1-butene), poly(ethylene-co-1-pentene), poly(styrene), acrylics, polyurethanes, sulfonated polyester urethane dispersions, nonsulfonated urethane dispersions, urethane-styrene polymer dispersions, non-ionic polyester urethane dispersions, acrylic dispersions, silanated anionic acrylate-styrene polymer dispersions, anionic acrylate-styrene dispersions, anionic acrylate-styrene-acrylonitrile dispersions, acrylate-acrylonitrile dispersions, vinyl chloride-ethylene emulsions, vinylpyrrolidone/styrene copolymer emulsions, carboxylated and noncarboxylated vinyl acetate ethylene dispersions, vinyl acetate homopolymer dispersions, polyvinyl chloride emulsions, polyvinylidene fluoride dispersions, ethylene acrylic acid dispersions, polyamide dispersions, anionic carboxylated or noncarboxylated acrylonitrile-butadiene-styrene emulsions and acrylonitrile emulsions, resin dispersions derived from styrene, resin dispersions derived from aliphatic and/or aromatic hydrocarbons, styrene-maleic anhydrides, and the like and mixtures thereof.

In another particular embodiment, the adhesive or primer is a silane that incorporates an amine function. Specific examples of such materials include, but are not limited to, gamma-aminopropyltriethoxysilane, N-beta-(aminoethyl)-gamma-aminopropyl-trimethoxysilane, and the like and mixtures thereof. Commercial examples of such materials include, e.g., Silquest® 1100 Silane (GE Silicones, Friendly, W. Va., believed to be gamma-aminopropyltrimethoxysilane) and Dow Corning® Z6020 Silane (Dow Corning Corporation, Midland, Mich.).

The adhesives may be applied through melt processes or through solution, emulsion, dispersion, and other suitable coating processes. One of ordinary skill in the art will be able to identify appropriate process parameters based on the composition and process used for the coating formation. The above process conditions and parameters for making coatings by any method in the art are easily determined by a skilled artisan for any given composition and desired application. For example, the adhesive or primer composition can be cast, sprayed, air knifed, brushed, rolled, poured or printed onto the surface. Generally the adhesive or primer is diluted into a liquid medium prior to application to provide uniform coverage over the surface. The liquid media may function as a solvent for the adhesive or primer to form solutions or may function as a non-solvent for the adhesive or primer to form dispersions or emulsions. Adhesive coatings may also be applied by spraying the molten, atomized adhesive or primer composition onto the surface. Such processes are disclosed within the art for wax coatings in, e.g., U.S. Pat. No. 5,078,313; U.S. Pat. No. 5,281,446; and U.S. Pat. No. 5,456,754.

V. Solar Cell Pre-Laminate Assembly Constructs:

Notably, specific solar cell laminate constructs (top (light incident) side to back side) include, but are not limited to:

glass/ionomer encapsulant layer/solar cell component/non-ionomer encapsulant layer/glass;

glass/ionomer encapsulant layer/solar cell component/non-ionomer encapsulant layer/fluoropolymer film (e.g., Tedlar® fluoropolymer film);

fluoropolymer film/ionomer encapsulant layer/solar cell component/non-ionomer encapsulant layer/glass;

fluoropolymer film/ionomer encapsulant layer/solar cell component/non-ionomer encapsulant layer/fluoropolymer film;

glass/ionomer encapsulant layer/solar cell component/non-ionomer encapsulant layer/PET film;

fluoropolymer film/ionomer encapsulant layer/solar cell component/non-ionomer encapsulant layer/PET film;

glass/ionomer encapsulant layer/solar cell component/non-ionomer encapsulant layer/barrier coated film/ionomer encapsulant layer/glass;

glass/ionomer encapsulant layer/solar cell component/non-ionomer encapsulant layer/barrier coated film/ionomer encapsulant layer/fluoropolymer film;

fluoropolymer film/ionomer encapsulant layer/barrier coated film/ionomer encapsulant layer/solar cell component/non-ionomer encapsulant layer/barrier coated film/non-ionomer encapsulant layer/fluoropolymer film;

glass/ionomer encapsulant layer/solar cell component/ non-ionomer encapsulant layer/aluminum stock;

fluoropolymer film/ionomer encapsulant layer/solar cell component/non-ionomer encapsulant layer/aluminum stock;

glass/ionomer encapsulant layer/solar cell component/ non-ionomer encapsulant layer/galvanized steel sheet;

glass/ionomer encapsulant layer/solar cell component/ non-ionomer encapsulant layer/PET film/ionomer encapsulant layer/aluminum stock;

fluoropolymer film/ionomer encapsulant layer/solar cell component/non-ionomer encapsulant layer/PET film/ ionomer encapsulant layer/aluminum stock;

glass/ionomer encapsulant layer/solar cell component/ non-ionomer encapsulant layer/PET film/non-ionomer encapsulant layer layer/galvanized steel sheet;

fluoropolymer film/ionomer encapsulant layer/solar cell component/non-ionomer encapsulant layer/PET film/ ionomer encapsulant layer/galvanized steel sheet;

and the like.

Manufacture of Solar Cell Module or Laminate

The invention is further directed to a process of manufacturing solar cell modules by subjecting the solar cell pre-laminate assemblies disclosed above to a lamination process, as described below.

The lamination process used herein may be an autoclave or non-autoclave process. For example, the solar cell pre-laminate assembly described above may be laid up in a vacuum lamination press and laminated together under vacuum with heat and standard atmospheric or elevated pressure In an exemplary process, a glass sheet, a first encapsulant layer, a solar cell component, a second encapsulant layer, a backing layer (e.g., a fluoropolymer film, such as a Tedlar® fluoropolymer film), and a cover glass sheet are laid up and laminated together under heat and pressure and a vacuum (for example, in the range of about 27-28 inches (689-711 mm) Hg) to remove air. Preferably, the glass sheet has been washed and dried. A typical glass type is 90 mil thick annealed low iron glass. In an exemplary procedure, the pre-laminate assembly of the present invention is placed into a bag capable of sustaining a vacuum ("a vacuum bag"), drawing the air out of the bag using a vacuum line or other means of pulling a vacuum on the bag, sealing the bag while maintaining the vacuum, placing the sealed bag in an autoclave at a temperature of about 120° C. to about 180° C., at a pressure of about 150-250, preferably about 200 psi (about 15 bars), for from about 10 to about 50 minutes. Preferably the bag is autoclaved at a temperature of from about 120° C. to about 160° C. for about 20 to about 45 minutes. More preferably the bag is autoclaved at a temperature of from about 135° C. to about 160° C. for about 20 to about 40 minutes. A vacuum ring may be substituted for the vacuum bag. One type of vacuum bags is disclosed within U.S. Pat. No. 3,311,517.

Any air trapped within the pre-laminate assembly may be removed through a nip roll process. For example, the pre-laminate assembly may be heated in an oven at a temperature between about 80° C. and about 120° C., or preferably, at a temperature of between about 90° C. and about 100° C., for about 15-60 (preferably about 30) minutes. Thereafter, the heated pre-laminate assembly is passed through a set of nip rolls so that the air in the void spaces between the surface layers (i.e., the incident and backing layers), the solar cell(s) and the encapsulant layers may be squeezed out, and the edge of the assembly sealed. This process may provide the final solar cell module or may provide what is referred to as a pre-press assembly, depending on the materials of construction and the exact conditions utilized.

The pre-press assembly may then be placed in an air autoclave where the temperature is raised to between about 120° C. and about 160° C., or preferably, between about 135° C. and about 160° C., and pressure to between about 100 psig and about 300 psig, or preferably, about 200 psig (14.3 bar). These conditions are maintained for about 15 minutes to about 1 hour, or preferably, about 20 to about 50 minutes, after which, the air is cooled while no more air is added to the autoclave. After about 10-30 (preferably about 20) minutes of cooling, the excess air pressure is vented and the solar cell laminates are removed from the autoclave. This should not be considered limiting. Essentially any lamination process known within the art may be used herein.

A non-autoclave lamination process has been disclosed, e.g., within U.S. Pat. No. 3,234,062; U.S. Pat. No. 3,852,136; U.S. Pat. No. 4,341,576; U.S. Pat. No. 4,385,951; U.S. Pat. No. 4,398,979; U.S. Pat. No. 5,536,347; U.S. Pat. No. 5,853, 516; U.S. Pat. No. 6,342,116; U.S. Pat. No. 5,415,909; US 2004-0182493; US 2003-0148114 A1; EP 1 235 683 B1; WO 91/01880 and WO 03/057478 A1. Generally, the non-autoclave process includes heating the pre-laminate assembly or the pre-press assembly and, optionally, the application of vacuum, pressure or both. For example, the pre-press may be successively passed through heating ovens and nip rolls.

If desired, the edges of the solar cell module or laminate may be sealed to reduce moisture and air intrusion and the potential degradation effect on the efficiency and lifetime of the solar cell(s) by any means disclosed within the art. Suitable edge seal materials include, but are not limited to, butyl rubber, polysulfide, silicone, polyurethane, polypropylene elastomers, polystyrene elastomers, block elastomers, styrene-ethylene-butylene-styrene (SEBS), and the like.

EXAMPLES

The following Examples are intended to be illustrative of the present invention, and are not intended in any way to limit the scope of the present invention. The solar cell interconnections are omitted from the examples below to clarify the structures, but any common art solar cell interconnections may be utilized within the present invention.

Methods

The following methods are used in the Examples presented hereafter.

I. Lamination Process 1:

The laminate layers described below are stacked (laid up) to form the pre-laminate assembly described within the examples. For the assembly containing a film layer as the incident or backing layer, a cover glass sheet is placed over the film layer. The pre-laminate assembly is then placed within a vacuum bag, the vacuum bag is sealed and a vacuum is applied to remove the air from the vacuum bag. The bag is placed into an oven and while maintaining the application of the vacuum to the vacuum bag, the vacuum bag is heated at 135° C. for 30 minutes. The vacuum bag is then removed from the oven and allowed to cool to room temperature (25±5° C.). The laminate is then removed from the vacuum bag after the vacuum is discontinued.

II. Lamination Process 2:

The laminate layers described below are stacked (laid up) to form the pre-laminate assemblies described within the examples. For the assembly containing a film layer as the incident or backing layer, a cover glass sheet is placed over the film layer. The pre-laminate assembly is then placed within a vacuum bag, the vacuum bag is sealed and a vacuum is applied to remove the air from the vacuum bag. The bag is placed into an oven and heated to 90-100° C. for 30 minutes to remove any air contained between the assembly layers. The pre-press assembly is then subjected to autoclaving at 135° C. for 30 minutes in an air autoclave to a pressure of 200 psig (14.3 bar), as described above. The air is then cooled while no more air is added to the autoclave. After 20 minutes of cooling when the air temperature reaches less than about 50° C., the excess pressure is vented, and the laminate is removed from the autoclave.

Examples 1-12

12-inch by 12-inch solar cell structures described below in Table 1 are assembled and laminated by Lamination Process 1, above. Layers 1 and 2 constitute the incident layer and the front encapsulant layer of the solar cell laminate, respectively, and Layers 4 and 5 constitute the back encapsulant layer and the backing layer of the solar cell laminate, respectively.

TABLE 1

Solar Cell Laminate Structures

| Example | Layer 1 | Layer 2 | Layer 3 | Layer 4 | Layer 5 |
|---|---|---|---|---|---|
| 1, 13 | Glass 1 | Ionomer 1 | Solar Cell 1 | EVA 1 | Glass 1 |
| 2, 14 | Glass 2 | Ionomer 2 | Solar Cell 2 | PVB 1 | Glass 2 |
| 3, 15 | Glass 1 | Ionomer 3 | Solar Cell 3 | EVA 2 | Glass 2 |
| 4, 16 | Glass 1 | PVB A | Solar Cell 4 | Ionomer 3 | Glass 2 |
| 5, 17 | FPF | Ionomer 4 | Solar Cell 1 | EVA 3 | FPF |
| 6, 18 | Glass 1 | Ionomer 5 | Solar Cell 1 | ACR 1 | Glass 3 |
| 7, 19 | FPF | Ionomer 6 | Solar Cell 4 | EBA | AL |
| 8, 20 | Glass 1 | Ionomer 1 | Solar Cell 1 | ACR 2 | AL |
| 9, 21 | Glass 2 | Ionomer 2 | Solar Cell 4 | PVB 2 | AL |
| 10, 22 | FPF | Ionomer 4 | Solar Cell 1 | ACR 3 | Glass 2 |
| 11, 23 | FPF | Ionomer 5 | Solar Cell 4 | EMA | FPF |
| 12, 24 | Glass 1 | Ionomer 6 | Solar Cell 1 | PVB A | AL |

ACR 1 is a 20 mil (0.51 mm) thick embossed sheet of a poly(ethylene-co-methacrylic acid) containing 15 wt % of the comonomer methacrylic acid and having a MI of 5.0 g/10 minutes (190° C., ISO 1133, ASTM D1238).
ACR 2 is a 20 mil (0.51 mm) thick embossed sheet of a poly(ethylene-co-methacrylic acid) containing 18 wt % of the comonomer methacrylic acid and having a MI of 2.5 g/10 minutes (190° C., ISO 1133, ASTM D1238).
ACR 3 is a 2 mil (0.05 mm) thick embossed sheet of a poly(ethylene-co-methacrylic acid) containing 21 wt % of the comonomer methacrylic acid and having a MI of 5.0 g/10 minutes (190° C., ISO 1133, ASTM D1238).
AL is an aluminum sheet (3.2 mm thick) and is 5052 alloyed with 2.5 wt % of magnesium and conforms to Federal specification QQ-A-250/8 and ASTM B209.
EBA is a 20 mil (0.51 mm) thick sheet of a poly(ethylene-co-butyl acrylate) containing 20 wt % of the comonomer butyl acrylate based.
EMA is a 20 mil (0.51 mm) thick sheet of a poly(ethylene-co-methyl acrylate) containing 20 wt % of the comonomer methyl acrylate.
EVA 1 is SC50B, believed to be a 20 mil (0.51 mm) thick sheet of a poly(ethylene-co-vinyl acetate) (Hi-Sheet Industries, Ltd., JP)
EVA 2 is a Evasafe ® ethylene vinyl acetate sheet having a thickness of 17 mil (0.43 mm) (Bridgestone Corporation, Nashville, TN).
EVA 3 is 2 mil (0.05 mm) thick film of a poly(ethylene-co-vinyl acetate).
FPF is a 1.5 mil (0.38 mm) thick corona surface treated Tedlar ® film (DuPont).
Glass 1 is Starphire ® glass (PPG Industries, Pittsburgh, PA).
Glass 2 is a 2.5 mm thick clear annealed float glass plate layer.
Glass 3 in a 3.0 mm thick Solex ® solar control glass (PPG Industries, Pittsburgh, PA).
Ionomer 1 is a 20 mil (0.51 mm) thick embossed sheet of a poly(ethylene-co-methacrylic acid) containing 15 wt % of the comonomer methacrylic acid that is 35% neutralized with zinc ion and having a MI of 5 g/10 minutes (190° C., ISO 1133, ASTM D1238). Ionomer 1 is prepared from a poly(ethylene-co-methacrylic acid) having a MI of 60 g/10 minutes.
Ionomer 2 is a 20 mil (0.51 mm) thick embossed sheet of a poly(ethylene-co-methacrylic acid) containing 18 wt % of the comonomer methacrylic acid that is 35% neutralized with sodium ion and having a MI of 2.5 g/10 minutes (190° C., ISO 1133, ASTM D1238). Ionomer 2 is prepared from a poly(ethylene-co-methacrylic acid) having a MI of 60 g/10 minutes.
Ionomer 3 is a 90 mil (2.25 mm) thick embossed sheet of a poly(ethylene-co-methacrylic acid) containing 18 wt % of the comonomer methacrylic acid that is 30% neutralized with zinc ion and having a MI of 1 g/10 minutes (190° C., ISO 1133, ASTM D1238). Ionomer 3 is prepared from a poly(ethylene-co-methacrylic acid) having a MI of 60 g/10 minutes.
Ionomer 4 is a 2 mil (0.05 mm) thick film of the same copolymer of Ionomer 3.
Ionomer 5 is a 20 mil (0.51 mm) thick embossed sheet of a poly(ethylene-co-methacrylic acid) containing 20 wt % of the comonomer methacrylic acid that is 28% neutralized with zinc ion and having a MI of 1.5 g/10 minutes (190° C., ISO 1133, ASTM D1238). Ionomer 5 is prepared from a poly(ethylene-co-methacrylic acid) having an MI of 25 g/10 minutes.
Ionomer 6 is a 20 mil (0.51 mm) thick embossed sheet of a poly(ethylene-co-methacrylic acid) containing 22 wt % of the comonomer methacrylic acid that is 26% neutralized with zinc ion and having a MI of 0.75 g/10 minutes (190° C., ISO 1133, ASTM D1238). Ionomer 6 is prepared from a poly(ethylene-co-methacrylic acid) having a MI of 60 g/10 minutes.
PVB 1 is B51V, believed to be a formulated composition based on poly(vinyl butyral) in the form of a 20 mil (0.51 mm) thick sheet (DuPont).
PVB 2 is B51S, believed to be a formulated composition based on poly(vinyl butyral) in the form of a 20 mil (0.51 mm) thick sheet (DuPont).
PVB A is an acoustic poly(vinyl butyral) sheet including 100 parts per hundred (pph) poly(vinyl butyral) with a hydroxyl number of 15 and plasticized with 48.5 pph plasticizer tetraethylene glycol diheptanoate prepared similarly to that is disclosed in WO 2004/039581.
Solar Cell 1 is a 10-inch by 10-inch amorphous silicon photovoltaic device comprising a stainless steel substrate (125 micrometers thick) with an amorphous silicon semiconductor layer (U.S. Pat. No. 6,093,581, Example 1).
Solar Cell 2 is a 10-inch by 10-inch copper indium diselenide (CIS) photovoltaic device (U.S. Pat. No. 6,353,042, column 6, line 19).
Solar Cell 3 is a 10-inch by 10-inch cadmium telluride (CdTe) photovoltaic device (U.S. Pat. No. 6,353,042, column 6, line 49).
Solar Cell 4 is a silicon solar cell made from a 10-inch by 10-inch polycrystalline EFG-grown wafer (U.S. Pat. No. 6,660,930, column 7, line 61).

The embossed sheet structures noted above are prepared on an extrusion sheeting line equipped with embossing rolls utilizing common art sheet formation processes. This essentially entailed the use of an extrusion line consisting of a twin-screw extruder with a sheet die feeding melt into a calendar roll stack. The calendar rolls have an embossed surface pattern engraved into the metal surface which imparts to varying degrees a reverse image of the surface texture onto the polymer melt as it passes between and around the textured rolls. Both surfaces of the sheet are embossed with a pattern with the following characteristics:

| | |
|---|---|
| Mound average depth | 21 +/− 4 micron; |
| Mound peak depth | 25 +/− 5 micron; |
| Pattern frequency/mm | 2; |
| Mound width mm | 0.350 +/− 0.02 mm; and |
| Valley width | 0.140 +/− 0.02 mm. |

Surface roughness, Rz, can be expressed in microns by a 10-point average roughness in accordance with ISO-R468 of the International Organization for Standardization. Roughness measurements are made using a stylus-type profilometer (Surfcom 1500A manufactured by Tokyo Seimitsu Kabushiki Kaisha of Tokyo, Japan) as described in ASME B46.1-1995 using a trace length of 26 mm. ARp and ARt, and the area kurtosis are measured by tracing the roughness over a 5.6 mm×5.6 mm area in 201 steps using the Perthometer Concept system manufactured by Mahr GmbH, Gottingen, Germany. The sheet is found to have an Rz in the range of from about 15 to about 25 micron.

Examples 13-24

12-inch by 12-inch solar cell laminate structures described above in Table 1 are assembled and laminated by Lamination Process 2, above. Layers 1 and 2 constitute the incident layer and the front encapsulant layer of the solar cell laminate, respectively, and Layers 4 and 5 constitute the back encapsulant layer and the backing layer of the solar cell laminate, respectively.

What is claimed is:
1. A solar cell pre-laminate assembly comprising:
  (i) a solar cell component comprising one or a plurality of solar cells and having a light-receiving side and a back side,
  (ii) a first encapsulant layer positioned next to the light-receiving side of the solar cell component consisting essentially of an ionomeric copolymer of ethylene and about 15 to about 25 wt % of an alpha, beta-ethylenically unsaturated carboxylic acid selected from the group consisting of acrylic acid, methacrylic acid, or a mixture thereof, based on the total weight of the copolymer, wherein the carboxylic acid is neutralized to a level of about 10 to 100 mol %, with one or more metal ions, based on the total number of moles of carboxylate groups in the copolymer, and
  (iii) a second encapsulant layer positioned next to the back side of the solar cell component consisting essentially of a non-ionomeric polymer selected from the group consisting of poly(ethylene-co-vinyl acetate) and plasticized poly(vinyl butyral),
  further comprising a fluoropolymer incident layer serving as an outer layer at the light-receiving side of the assembly, and a backing layer serving as an outer layer at the back side of the assembly.
2. The solar cell pre-laminate assembly of claim 1, wherein the non-ionomeric polymer is the poly(ethylene-co-vinyl acetate).

3. The solar cell pre-laminate assembly of claim 1, wherein the non-ionomeric polymer is the plasticized poly(vinyl butyral).

4. The solar cell pre-laminate assembly of claim 1, wherein the incident layer is positioned next to the outer surface of the first encapsulant layer and the backing layer is positioned next to the outer surface of the second encapsulant layer.

5. The solar cell pre-laminate assembly of claim 1, wherein the backing layer is a sheet or film formed of a material selected from the group consisting of glass, polymers, and metals.

6. The solar cell pre-laminate assembly of claim 1, wherein the backing layer is formed of a fluoropolymer film or sheet.

7. The solar cell pre-laminate assembly of claim 1, wherein the one or a plurality of solar cells are selected from the group consisting of multi-crystalline solar cells, thin film solar cells, compound semiconductor solar cells, and amorphous silicon solar cells.

8. A solar cell pre-laminate assembly consisting essentially of, from top to bottom, (i) a fluoropolymer incident layer that is positioned next to, (ii) an about 1 mil to about 120 mils ionomeric copolymer front encapsulant layer that is positioned next to, (iii) a solar cell component comprising one or a plurality of solar cells, which is positioned next to, (iv) an about 1 mil to about 120 mils poly(ethylene-co-vinyl acetate) or plasticized poly(vinyl butyral) back encapsulant layer that is positioned next to, (v) a backing layer, wherein the front encapsulant layersonsists essentially of an ionomeric copolymer of ethylene and about 15 to about 25 wt % of an alpha, beta-ethylenically unsaturated carboxylic acid selected from the group consisting of acrylic acid, methacrylic acid, or a mixture thereof, based on the total weight of the copolymer, and wherein the carboxylic acid is neutralized to a level of about 10 to 100 mol %, with one or more metal ions, based on the total number of moles of carboxylate groups in the copolymer.

9. A process of manufacturing a solar cell module comprising:
(i) providing a solar cell pre-laminate assembly as described in claim 1 and (ii) laminating the assembly to form the solar cell module.

10. A process of manufacturing a solar cell module comprising: (i) providing a solar cell pre-laminate assembly as described in claim 8 and (ii) laminating the assembly to form the solar cell module.

11. The process of claim 9, wherein the step (ii) of lamination is conducted by subjecting the assembly to heat.

12. The process of claim 11, wherein the step (ii) of lamination further comprising subjecting the assembly to vacuum.

13. A solar cell module prepared by laminating the solar cell pre-laminate assembly of claim 1.

14. The solar cell pre-laminate assembly of claim 1, wherein the first encapsulant layer is a sheet consisting essentially of the ionomeric copolymer and the second encapsulant layer is a sheet consisting essentially of the non-ionomeric polymer.

15. The solar cell pre-laminate assembly of claim 8, wherein the front encapsulant layer is a sheet consisting essentially of the ionomeric copolymer and the back encapsulant layer is a sheet consisting essentially of the poly(ethylene-co-vinyl acetate) or plasticized poly(vinyl butyral).

16. A solar cell module comprising:
(i) a solar cell component comprising one or a plurality of solar cells and having a light-receiving side and a back side,
(ii) a first encapsulant positioned next to the light-receiving side of the solar cell component consisting essentially of an ionomeric copolymer of ethylene and about 15 to about 25 wt % of an alpha,beta-ethylenically unsaturated carboxylic acid selected from the group consisting of acrylic acid, methacrylic acid, or a mixture thereof, based on the total weight of the copolymer, wherein the carboxylic acid is neutralized to a level of about 10 to 100 mol %, with one or more metal ions, based on the total number of moles of carboxylate groups in the copolymer, and
(iii) a second encapsulant positioned next to the back side of the solar cell component consisting essentially of a non-ionomeric polymer selected from the group consisting of poly(ethylene-co-vinyl acetate) and plasticized poly(vinyl butyral),
further comprising a fluoropolymer incident layer serving as an outer layer at the light-receiving side of the assembly, and a backing layer serving as an outer layer at the back side of the assembly.

17. The solar cell module of claim 16, wherein the non-ionomeric polymer is the poly(ethylene-co-vinyl acetate).

18. The solar cell module of claim 16, wherein the non-ionomeric polymer is the plasticized poly(vinyl butyral).

* * * * *